United States Patent
Chao et al.

(10) Patent No.: US 10,476,019 B2
(45) Date of Patent: Nov. 12, 2019

(54) ORGANIC OPTOELECTRONIC DEVICE AND METHOD FOR MANUFACTURING THE SAME

(71) Applicant: LUMINESCENCE TECHNOLOGY CORPORATION, Hsinchu (TW)

(72) Inventors: Ching-Yan Chao, Hsinchu (TW); Feng-Wen Yen, Taipei (TW)

(*) Notice: Subject to any disclaimer, the term of this patent is extended or adjusted under 35 U.S.C. 154(b) by 0 days.

(21) Appl. No.: 15/975,781

(22) Filed: May 10, 2018

(65) Prior Publication Data
US 2018/0331311 A1    Nov. 15, 2018

(30) Foreign Application Priority Data

May 11, 2017 (TW) .............................. 106115564 A
Sep. 5, 2017 (CN) .......................... 2017 1 0791290

(51) Int. Cl.
*H01L 51/44* (2006.01)
*H01L 27/32* (2006.01)
*H01L 51/52* (2006.01)
*H01L 51/56* (2006.01)

(52) U.S. Cl.
CPC ........ *H01L 51/442* (2013.01); *H01L 51/5203* (2013.01); *H01L 51/56* (2013.01); *H01L 27/3246* (2013.01); *H01L 27/3248* (2013.01)

(58) Field of Classification Search
CPC ........ H01L 51/44; H01L 51/52; H01L 51/56; H01L 27/3248; H01L 27/3246; H01L 27/3204; H01L 51/442

USPC ...................... 257/40, 72.89; 438/48, 82, 99
See application file for complete search history.

(56) References Cited

U.S. PATENT DOCUMENTS

| | | | |
|---|---|---|---|
| 2006/0001033 A1* | 1/2006 | Tsujimura et al. | H01L 27/3204 257/88 |
| 2008/0218061 A1 | 9/2008 | Chao et al. | |
| 2008/0252201 A1* | 10/2008 | Pearce et al. | H01L 51/0015 313/504 |

* cited by examiner

*Primary Examiner* — Thinh T Nguyen

(57) ABSTRACT

The present invention provides an organic optoelectronic device and method for manufacturing the same. The method deposits the organic layer and the second electrode layer in the same range, and laser scans the second electrode layer at a plurality of first predetermined locations to form electrical connections between the second electrode layer and the contact electrodes. The present invention can effectively reduce the number of times for metal mask positioning and replacement to significantly reduce the manufacturing time and decrease the contamination resulted from the replacement of the metal mask. Besides, the electrical connection formed by laser scanning can connect a plurality of organic optoelectronic components in series and arrange them side by side. The present invention can be applied to organic optoelectronic device, such as OLED devices and OPV devices.

4 Claims, 3 Drawing Sheets

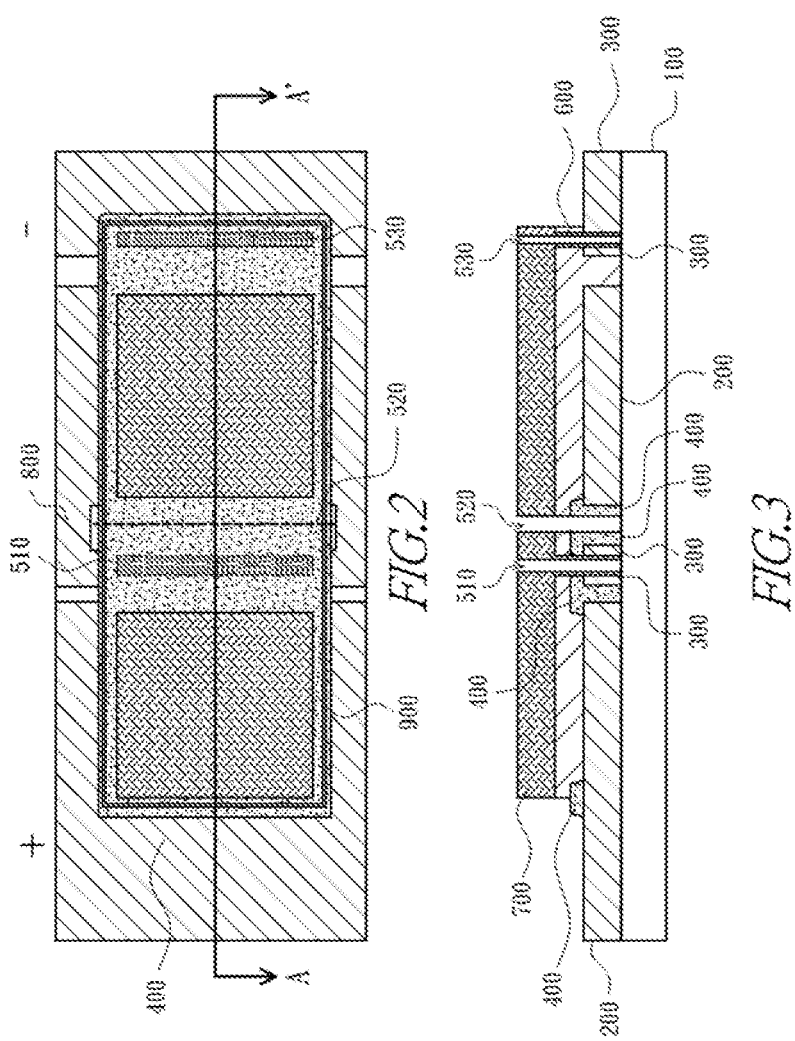

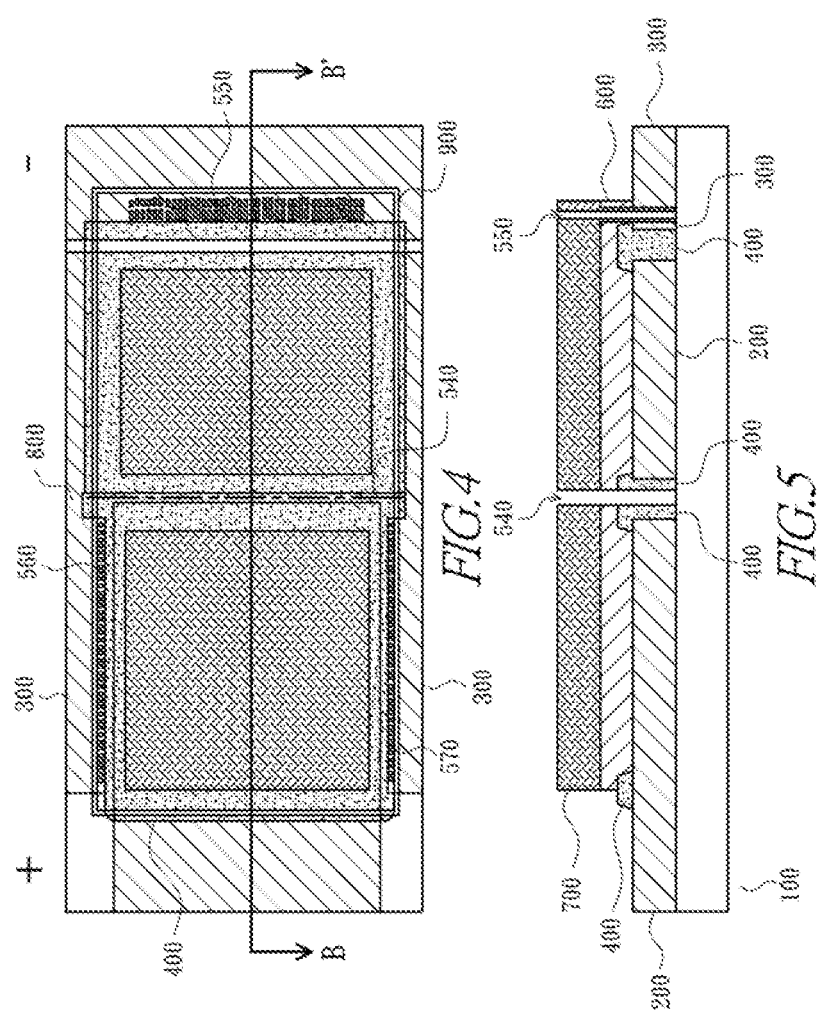

ORGANIC OPTOELECTRONIC DEVICE AND METHOD FOR MANUFACTURING THE SAME

CROSS-REFERENCE TO RELATED APPLICATIONS

This application claims the benefit of priority of TW Patent Application Ser. No. 106115564 filed on May 11, 2017, the content of which is incorporated herein by reference in its entirety.

FIELD OF INVENTION

The present invention relates to an organic optoelectronic device and method for manufacturing the same and, more particularly, to an organic optoelectronic device composed of a plurality of organic optoelectronic components connected in series and arranged side by side and method for manufacturing the same.

BACKGROUND OF THE INVENTION

In recent years, the organic optoelectronic device has been developing quite rapidly. Both organic light-emitting diode (OLED) and organic photovoltaic (OPV) device have achieved great advance in academics and industries, and their qualities are gradually close to those of inorganic optoelectronic device. Basically, the organic optoelectronic device is formed by sandwiching proper organic thin film materials between two electrode layers. Upon the application of voltage, the electrons and holes are recombined in the organic compound layer to emit light. OLED can be applied to the tablet display and lighting device due to the advantages of self-illumination, high brightness, light weight, ultra-thin profile, low power consumption, wide viewing angle, simple manufacturing process, quick response time, etc. As to the OPV device, the electrons will transit across the energy gap of the organic compound upon absorption of external light. Subsequently, the electrons and holes will separate and move in the organic compound layer to form the photocurrent. The OPV device gradually attracts attention from the industries due to the advantages of light weight, ultra-thin profile, simple manufacturing process, low cost, etc.

In the practical application of organic optoelectronic device, the series connection of devices has its importance and necessity. Generally, under a fixed luminance, an OLED device with a large light emitting area has a large operating current, resulting in deterioration of luminance uniformity of the light emitting surface, which is due to the voltage drop difference caused by impedance. At the same time, large operating current also tends to cause short circuit at the sites where the thickness is not uniform or particles are attached in the OLED device. On the other hand, if the OLED device is divided into several OLED components, each having a smaller area and connected in series, then the operating current of the OLED device can be significantly reduced which further improves the uniformity of luminance and simultaneously decrease the risk of short circuit in the OLED device. Similarly, for the OPV device, if it is divided into several OPV components, each having a smaller area and connected in series, the open circuit voltage of the OPV device can be significantly increased, and the risk of short circuit in the OPV device can also be decreased. In the currently available processes for manufacturing OLED components connected in series and arranged side by side, the electrode layers and organic layers need to be deposited respectively by using different metal masks according to the variously defined structures and patterns. However, every metal mask replacement needs to spend a lot of time for re-aligning and positioning. Moreover, during the replacement process, the OLED components are easily contaminated by the particles, and the metal mask is also easily damaged. Therefore, it has become an important issue to effectively simplify the manufacturing process for OLED components connected in series and arranged side by side, to improve the yield of the OLED device simultaneously, and to further achieve the reduction of the manufacturing time and production cost.

SUMMARY OF THE INVENTION

In view of the above problems of the conventional technique, the present invention provides a method for manufacturing an organic optoelectronic device to effectively simplify the manufacturing process for OLED device, to improve the yield rate of the OLED device, and to reduce the manufacturing time and production cost.

The present invention provides a method for manufacturing an organic optoelectronic device composed of a plurality of organic optoelectronic components connected in series and arranged side by side; the method includes the following steps:

depositing an electrode layer on a substrate;

forming a plurality of spacers in the electrode layer, wherein the plurality of spacers divide the electrode layer into a plurality of first electrodes and a plurality of contact electrodes;

depositing an organic layer on the first electrodes, the spacers, and the contact electrodes through a metal mask;

depositing a second electrode layer on the organic layer through the metal mask;

laser scanning the second electrode layer at a plurality of first predetermined locations to remove a portion of the second electrode layer, the organic layer, and the contact electrode, and at a plurality of second predetermined locations to remove a portion of the second electrode layer, the organic layer, and the spacer simultaneously, wherein the laser scanning uses a laser wavelength of 1064 nm and a power of less than 3 W; and electrically connecting the second electrode layer to the contact electrodes at the plurality of first predetermined locations, respectively.

The method further includes depositing at least one connection electrode connecting the first electrode and the contact electrode.

In an embodiment, the organic layer has the same deposition range as the second electrode layer.

The present invention further provides an organic optoelectronic device composed of a plurality of organic optoelectronic components connected in series and arranged side by side. The device includes a substrate, a plurality of first electrodes, a plurality of contact electrodes, an organic layer, and a second electrode layer. The first electrodes and the contact electrodes are separated by a plurality of spacers on the substrate. The organic layer is provided on the first electrodes, the spacers, and the contact electrodes. The second electrode layer is provided on the organic layer and electrically connected to the contact electrodes. The device further includes at least one connection electrode connecting the first electrode and the contact electrode.

In an embodiment, the electrical connection between the second electrode layer and the contact electrode is formed by laser scanning and the electrical connection is transparent.

BRIEF DESCRIPTION OF THE DRAWINGS

For a better understanding of the aforementioned embodiments of the invention as well as additional embodiments thereof, reference should be made to the Description of Embodiments below, in conjunction with the following drawings in which like reference numerals refer to corresponding parts throughout the figures.

FIG. 2 is a schematic top view showing an organic optoelectronic device composed of a plurality of organic optoelectronic components connected in series and arranged side by side in accordance with one embodiment of the present invention.

FIG. 3 is a schematic cross-sectional view taken along line A-A' of FIG. 2.

FIG. 4 is a schematic top view showing another organic optoelectronic device composed of a plurality of organic optoelectronic components connected in series and arranged side by side in accordance with another embodiment of the present invention.

FIG. 5 is a schematic cross-sectional view taken along line B-B' of FIG. 4.

DESCRIPTION OF THE PREFERRED EMBODIMENTS

Figure 1:
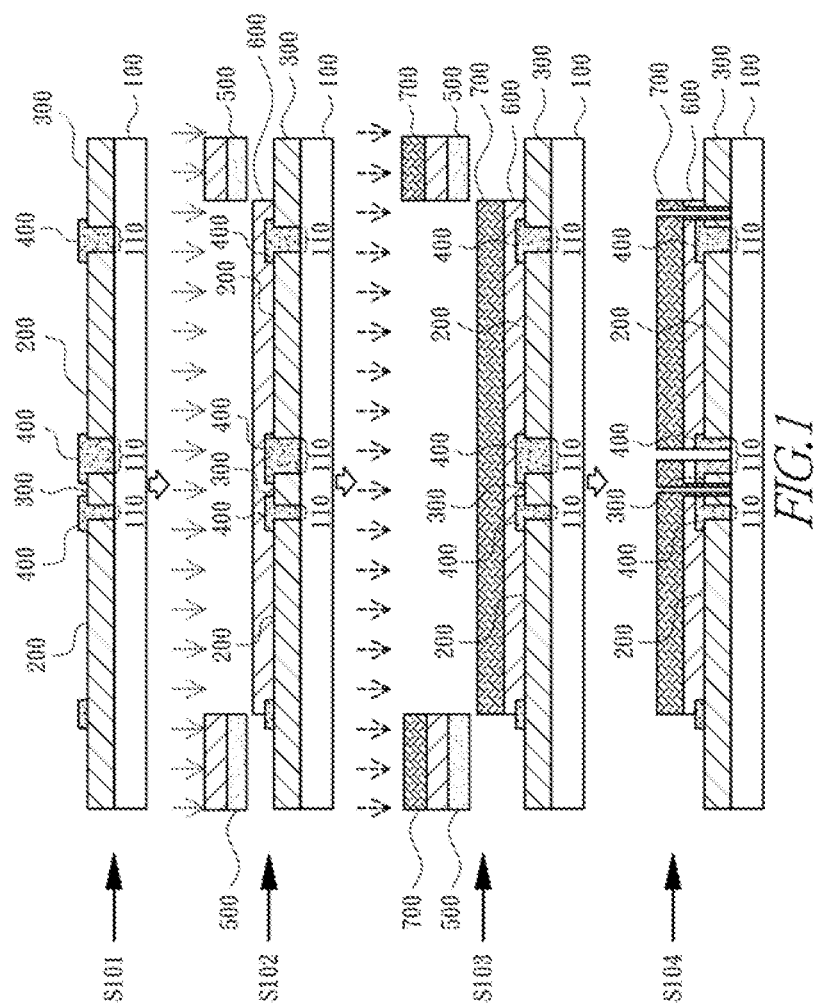
FIG. 1 is a flow chart showing a method for manufacturing an organic optoelectronic device composed of a plurality of organic optoelectronic components connected in series and arranged side by side in accordance with one embodiment of the present invention.

The following description is about embodiments of the present invention. However, it is not intended to limit the scope of the present invention.

With reference to FIG. 1, which is a flow chart showing a method for manufacturing an organic optoelectronic device composed of a plurality of organic optoelectronic components connected in series and arranged side by side in accordance with one embodiment of the present invention. The method includes the following steps:

S101: Depositing an electrode layer on the substrate 100 and forming a plurality of spacers 400 at the interval spaces 110 in the electrode layer. The spacers 400 divide the electrode layer into a plurality of first electrodes 200 and a plurality of contact electrodes 300.

S102: Depositing the organic layer 600 on the first electrodes 200, the spacers 400, and the contact electrodes 300 through the metal mask 500.

S103: Depositing the second electrode layer 700 on the organic layer 600 through the metal mask 500. The organic layer 600 has the same deposition range as the second electrode layer 700.

S104: Laser scanning the second electrode layer 700 at a plurality of first predetermined locations to remove a portion of the second electrode layer 700, the organic layer 600, and the contact electrode 300 and at a plurality of second predetermined locations to remove a portion of the second electrode layer 700, the organic layer 600, and the spacers 400 simultaneously. The second electrode layer 700 is electrically connected to the contact electrodes 300 at the plurality of first predetermined locations.

Please refer to FIGS. 2 and 3. FIG. 2 is a schematic top view showing an organic optoelectronic device composed of a plurality of organic optoelectronic components connected in series and arranged side by side in accordance with one embodiment of the present invention, and FIG. 3 is a schematic cross-sectional view taken along line A-A' of FIG. 2. The organic optoelectronic device includes the substrate 100, the first electrode 200, the contact electrode 300, the spacer 400, the organic layer 600, the second electrode layer 700, and the connection electrode 800. As shown in FIG. 2 and FIG. 3, an electrode layer may be deposited on the substrate 100, and a plurality of spacers 400 may be formed in the electrode layer to divide the electrode layer into a plurality of first electrodes 200 and a plurality of contact electrodes 300. In other words, each spacer 400 is formed between the first electrode 200 and the contact electrode 300. The organic layer 600 and the second electrode layer 700 may have the same deposition range 900, and are sequentially provided on the first electrode 200, the contact electrode 300, and the spacer 400. After the second electrode layer 700 is processed by laser scanning at the laser scanning sites 510, 520 and 530, the second electrode layer 700 is completely disconnected at the laser scanning site 520, where the device is divided into two individual components. However, at the laser scanning sites 510 and 530, the second electrode layer 700 forms an electrical connection with the contact electrode 300. The connection electrode 800 is further provided between the first electrode 200 and adjacent contact electrode 300 in order to electrically connect the first electrode 200 to the adjacent contact electrode 300. The connection electrode 800, the first electrode 200, and the contact electrode 300 may be formed by one-layer material or multi-layer material. Accordingly, the current can flow from the left component of FIG. 3 through the first electrode 200, the organic layer 600, and the second electrode layer 700, and then flows through the laser scanning site 510, the contact electrode 300, and the connection electrode 800 (as shown in FIG. 2) to the right component of FIG. 3 and flows through the first electrode 200, the organic layer 600, the second electrode layer 700, the laser scanning site 530, and the contact electrode 300 of the right component. In this way, the organic optoelectronic components of the organic optoelectronic device can be connected in series and arranged side by side.

Please refer to FIGS. 4 and 5. FIG. 4 is a schematic top view showing another organic optoelectronic device composed of a plurality of organic optoelectronic components connected in series and arranged side by side in accordance with another embodiment of the present invention, and FIG. 5 is a schematic cross-sectional view taken along line B-B' of FIG. 4. The organic optoelectronic device includes the substrate 100, the first electrode 200, the contact electrode 300, the spacer 400, the organic layer 600, the second electrode layer 700, and the connection electrode 800. As shown in FIG. 4 and FIG. 5, a plurality of first electrodes 200 are provided continuously from the left side to the right side on the substrate 100, and a plurality of contact electrodes 300 are provided at the remaining periphery on the substrate 100. A plurality of spacers 400 may be formed between the adjacent first electrodes 200 as well as between the first electrode 200 and the contact electrode 300. The organic layer 600 and the second electrode layer 700 may have the same deposition range 900, and are sequentially deposited on the first electrode 200, the contact electrode 300, and the spacer 400. After the second electrode layer 700 is processed by laser scanning at the laser scanning sites 540, 550, 560, and 570, the second electrode layer 700 is completely disconnected at the laser scanning site 540, where the device is divided into two individual components. However, at the laser scanning sites 550, 560, and 570, the second electrode layer 700 forms an electrical connection with the contact electrode 300. The connection electrode 800 is further provided between the adjacent first electrodes 200 in order to form the electrical connection between the first electrodes 200. The connection electrode 800, the first electrode 200, and the contact electrode 300 may be formed by one-layer material or multi-layer material. Accordingly, the current can flow from the left component of FIG. 5 through the first electrode 200, the organic layer 600, and the second electrode layer 700, and then flows through the laser scanning site 560, the laser scanning site 570 (as shown in FIG. 4), the contact electrode 300, and the connection electrode 800 to the right component of FIG. 5 and flows through the first electrode 200, the organic layer 600, the second electrode layer 700, the laser scanning site 550, and the contact electrode 300 of the right component. In this way, the organic optoelectronic components of the organic optoelectronic device can be connected in series and arranged side by side.

When being applied to manufacturing an organic optoelectronic device, the method of the present invention can effectively reduce the times of the positioning and replacement of the metal mask, which significantly reduces the manufacturing time and the contamination caused by the replacement of the metal mask. Besides, the electrical connection formed by laser scanning can connect a plurality of organic optoelectronic components in series and arrange them side by side. Further, the method of the present invention can be applied to the manufacturing process of OPV devices, OLED devices and other relevant fields, and can perform laser scanning in any patterns according to the definitions.

The above disclosure is related to the detailed technical contents and inventive features thereof. Those skilled in the art may make a variety of modifications and replacements based on the disclosures and suggestions of the invention as described without departing from the spirit thereof. Although such modifications and replacements are not fully disclosed in the above descriptions, they have substantially been covered by the following claims.

What is claimed is:

1. An organic optoelectronic device composed of a plurality of organic optoelectronic components connected in series and arranged side by side, comprising:
   a substrate;
   a plurality of first electrodes and a plurality of contact electrodes separated by a plurality of spacers on the substrate;
   an organic layer deposited on the first electrodes, the spacers, and the contact electrodes;
   a second electrode layer deposited on the organic layer and electrically connected to the contact electrodes by an electrical connection between the second electrode layer and each of the contact electrodes, wherein the organic layer and the second electrode layer have the same deposition range; and
   a first laser scanning site on each of the contact electrodes.

2. The organic optoelectronic device of claim 1, further comprising a second laser scanning site, wherein the second electrode layer is disconnected at the second laser scanning site.

3. The organic optoelectronic device of claim 1, wherein the electrical connection between the second electrode layer and each of the contact electrodes is transparent.

4. The organic optoelectronic device of claim 2, further comprising at least one connection electrode connecting the first electrode and the contact electrode.

* * * * *